United States Patent
Carlson (10) Patent No.: US 7,035,584 B2
(45) Date of Patent: Apr. 25, 2006

(54) ANTENNA PHASE MODULATOR

(75) Inventor: Dennis Carlson, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 226 days.

(21) Appl. No.: 10/424,444

(22) Filed: Apr. 28, 2003

(65) Prior Publication Data

US 2004/0214534 A1 Oct. 28, 2004

(51) Int. Cl.
*H04B 1/04* (2006.01)
*H01H 1/00* (2006.01)

(52) U.S. Cl. ...................... 455/3.01; 455/121
(58) Field of Classification Search ......... 343/700 MS, 343/702; 333/126; 342/118; 340/10.1; 455/121, 562.1, 69, 825, 3.01; 244/158
See application file for complete search history.

(56) References Cited

U.S. PATENT DOCUMENTS

| | | | | |
|---|---|---|---|---|
| 5,486,836 A | * | 1/1996 | Kuffner et al. | 343/700 MS |
| 5,680,417 A | | 10/1997 | Carlson | |
| 5,982,329 A | * | 11/1999 | Pittman et al. | 434/700 MS |
| 6,061,025 A | * | 5/2000 | Jackson et al. | 343/700 MS |
| 6,150,921 A | * | 11/2000 | Werb et al. | 340/10.1 |
| 6,211,830 B1 | * | 4/2001 | Monma et al. | 343/702 |
| 6,353,406 B1 | * | 3/2002 | Lanzl et al. | 342/118 |
| 6,424,259 B1 | * | 7/2002 | Gagnon | 340/554 |
| 6,606,483 B1 | * | 8/2003 | Baker et al. | 455/126 |
| 6,701,137 B1 | * | 3/2004 | Judd et al. | 455/121 |
| 6,812,808 B1 | * | 11/2004 | Gaukel et al. | 333/126 |
| 6,812,824 B1 | * | 11/2004 | Goldinger et al. | 340/10.1 |
| 6,866,231 B1 | * | 3/2005 | Higgins | 244/158 R |
| 2003/0114188 A1 | * | 6/2003 | Rousu | 455/553 |
| 2003/0207668 A1 | * | 11/2003 | McFarland et al. | 455/3.01 |

OTHER PUBLICATIONS

"BPSK and QPSK modulations of an oscillating antenna for transponding applications", L. Dussopt and J. M. Laheurte. IEE Proc. Microw. Antennas. Propag., vol. 147, No. 5, Oct. 2000, pp 335-338.

* cited by examiner

*Primary Examiner*—Tan Ho
*Assistant Examiner*—Hung Tran Vy (57) ABSTRACT

A phase modulator comprised of a plurality of circuit paths operates to receive a data signal and a radio frequency carrier signal and to couple the radio frequency carrier signal into an antenna at a feedpoint associated with a circuit path, whereby the electric field vector phase of the emitted radio frequency signal is determined by the data state of the received data signal. The circuit has at least one circuit path, which is determined by the data state of the input data signal, to couple the radio frequency carrier signal to the antenna feedpoint to adjust the phase.

30 Claims, 6 Drawing Sheets

ANTENNA PHASE MODULATOR

FIELD OF THE INVENTION

This invention relates generally to the phase modulation of radio frequency emission from an antenna where the phase is determined by the position of the feedpoints on the antenna. The feedpoints are determined by a data signal which routes the radio frequency carrier signal along a circuit path based on the data state of the data signal. More specifically the invention relates to bi-phase shift keyed, quadrature phase shift keyed and multiple phase shift keyed modulation of a radio frequency carrier.

BACKGROUND OF THE INVENTION

Typical binary or quadrature phase modulators use a passive double balanced mixer device to perform the phase modulation. Double balanced mixers require a bipolar data signal with positive and negative voltage swings to switch the PIN diodes in the mixer. A bipolar signal is not commonly found in data generating circuits, but rather unipolar signals are normally used, where the voltage swings from a positive voltage to zero volts. Extra circuitry is needed to generate the bipolar signal for the double balanced mixers of the prior art phase modulators. Capacitor coupling a unipolar data signal to the double balanced mixers is a typical manner in which to generate the positive and negative data signal voltages to switch the PIN diodes in the double balanced mixers. However capacitive coupling impairs the low end of the frequency response of the modulator so that long strings of digital 1's or 0's do not properly modulate. In addition, double balanced mixers used for this application can have as much as 10 dB insertion loss.

It is desirable to have an antenna modulator, which has less than 1 dB insertion loss, which operates with a unipolar data signal and has a frequency response extending from dc up to the low MHz range. It is also desirable to have an antenna modulator in which the antenna is a probe fed patch antenna, which radiates the radio frequency signal while providing the phase shifting correlated to the input data stream.

SUMMARY OF THE INVENTION

One aspect of the present invention provides a radio frequency communication device including an antenna, which has a plurality of space apart feedpoints, and a circuit, which includes a plurality of circuit paths operable to receive a data signal, and a radio frequency carrier signal where each circuit path is operably coupled to one of the feedpoints on the antenna. The circuit path routes the radio frequency carrier signal along a circuit path based on the data state of the data signal. The electric field vector phase of the radio frequency signal emitted from the antenna is adjusted based on the position of the feedpoint associated with the circuit path through which the radio frequency carrier signal is routed.

Another aspect of the present invention provides a method for operating a radio frequency communication device which comprises receiving a radio frequency carrier signal, receiving a data signal and determining at least one circuit path associated with a position along an antenna based on the data state of the data signal, and adjusting the electric field vector phase of a radio frequency signal emitted from the antenna, based on the determined circuit path.

A third aspect of the present invention provides a radio frequency communication device with means for receiving a radio frequency carrier signal, a means for receiving at least a first data signal, a means for determining a circuit path based on a data state of the first data signal and a means for adjusting the electric field vector phase of an emitted radio frequency signal based on the determined circuit path.

The forgoing device and other devices as well as features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

BRIEF DESCRIPTION OF THE DRAWINGS

The present invention is illustrated by way of example and not limitation in the accompanying figures, in which like references indicate similar elements, and in which.

DETAILED DESCRIPTION OF THE PRESENTLY PREFERRED EMBODIMENT

Figure 1:
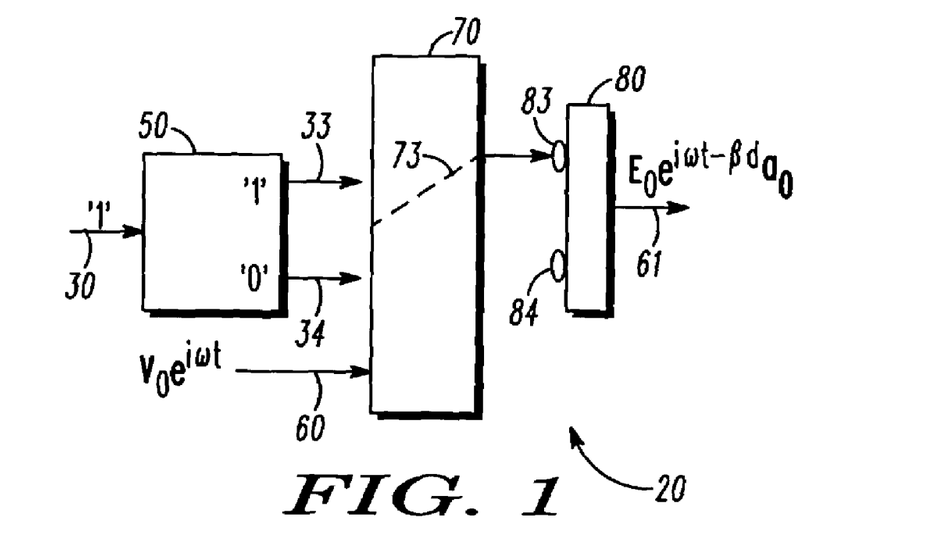
FIG. 1 illustrates a block diagram of a first embodiment of the bi-phase antenna modulator for a first data state.

FIG. 1 illustrates a block schematic of a bi-phase antenna modulator 20. An input data signal 30 with a logic 1 data state, indicated in these figures as '1,' is input into a data modifier circuit 50. A logic 1 data state corresponds to a positive voltage, which in one embodiment is 3.3 V and in another embodiment is 5 V. The data modifier circuit 50 outputs a first data signal 33 with the same data state as the input data signal 30, and a second data signal 34. The second data signal 34 is the complement of the first data signal 33 and thus has a logic 0 data state, indicated in these figures as '0'. A logic zero data state corresponds to 0 V. First data signal 33 and second data signal 34 form a first data signal pair 33-34 with a first data state 1-0. The first data signal pair 33-34 is input into a circuit 70 along with the radio frequency carrier signal 60 described as $V_0 e^{i\omega t}$. Circuit 70 has two circuit paths 73 and 74, which contact two feed points 83 and 84 of antenna 80. The radio frequency carrier signal is a continuous wave signal with a typical frequency range of 500 MHz to 10 GHz. The first data signal pair 33-34 adjusts the circuit 70, based on the first data state 1-0, to allow the radio frequency signal 60 to travel a first circuit path 73 to feed the antenna 80 at feedpoint 83. Additionally, the first data signal pair 33-34 adjusts the circuit 70, based on the first data state 1-0 to prevent the radio frequency signal 60 from traveling the second circuit path 74 (FIG. 2) to the second feedpoint 84 of antenna 80.

Antenna 80 is a probe fed circular patch antenna. It is connected to the ground plane through a resistor-capacitor circuit (not shown) at its center point and has a first feedpoint 83 and a second feedpoint 84, which lie on a diameter of antenna 80. First and second feedpoints 83, 84 are equidistant from the center point of antenna 80. When the radio frequency carrier signal 60 is fed into first feedpoint 83, a radio frequency signal 61 is emitted from the antenna 80 having a phase vector defined to be 0° for this description of a bi-phase antenna modulator. The emitted radio frequency signal 61 is described as the vector $E_0 e^{i\omega t - \beta d} a_0$ where $a_0$ is a unit vector whose direction defines 0° phase.

Figure 2:
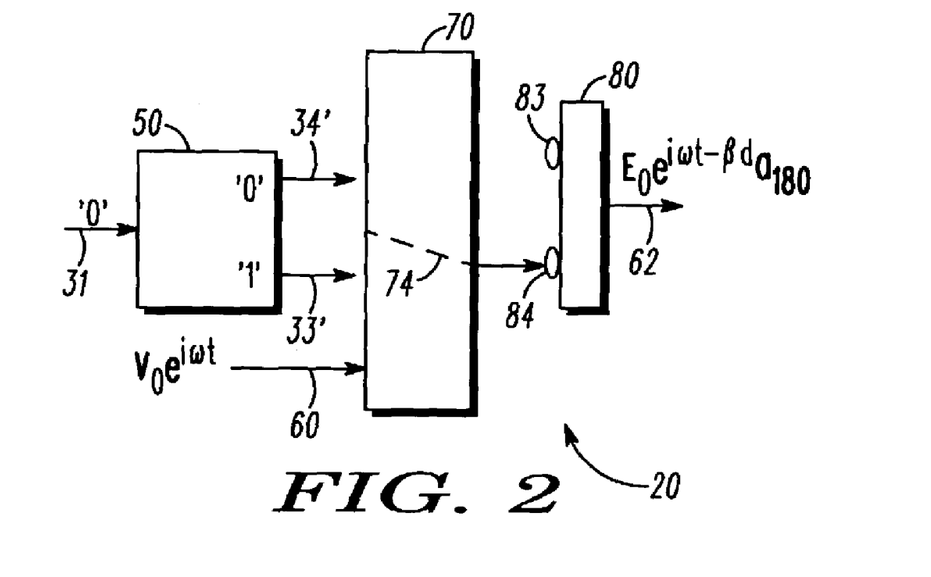
FIG. 2 illustrates a block diagram of a first embodiment of the bi-phase antenna modulator for a second data state.

FIG. 2 illustrates a block schematic of a bi-phase antenna modulator 20 where an input data signal 31 has a logic 0 data state. The input data signal 31 is input into the data modifier circuit 50. Given an input with logic 0 data state the output of data modifier circuit 50 is a third data signal 34' and a fourth data signal 33.' Third data signal 34' maintains the logic 0 state of the input data signal 31 and the fourth data signal 33' is the complement of the third data signal 34'. Third data signal 34' and fourth data signal 33' form a second data signal pair 34'-33', having second data state 0-1. The second data signal pair 34'-33' is input into the circuit 70 along with the radio frequency carrier signal 60. The second data signal pair 34'-33' adjusts the circuit 70, based on the second data state 0-1, to allow the radio frequency signal 60 to travel the second circuit path 74 to the second feedpoint 84 of antenna 80. Conversely, the second data signal pair 34'-33' adjusts the circuit 70 to prevent the radio frequency signal 60 from traveling the first circuit path 73 to the first feedpoint 83 of antenna 80.

Throughout this description when a logic 1 data state is input to the data modifier circuit 50 or 51, the output will have unprimed labels. When a logic 0 data state is input to the data modifier circuit 50 or 51, the output will have primed labels. A data signal pair with unprimed numbers will always have the first data state of 1-0 and a data signal pair with primed numbers will always have the second data state of 0-1.

When the radio frequency carrier signal 60 is fed into second feedpoint 84 a radio frequency signal 62 is emitted from the antenna 80. Radio frequency signal 62 has a phase vector which is shifted 180° from the phase vector of radio frequency signal 61 emitted when 83 is the active feedpoint and is described as vector $E_0 e^{i\omega t - \beta d} a_{180}$ where $a_{180}$ is a unit vector whose direction is 180° from the direction of $a_0$. Thus as data input signals 30 or 31 from a data stream (not shown), consisting of logic 1's and 0's at some data rate, are input to the antenna modulator 20, a bi-phase radio frequency signal 61 and 62 is emitted from the antenna 80. As is known to those of ordinary skill in the art, this is a Bi-Phase Shift Keying (BPSK) modulation technique, which depends upon the state of the input data signal 30 or 31. When the emitted radio frequency signals 61 and 62 are received and processed by a receiver (not shown) with a phase demodulator, the original information bearing data stream can be recovered.

BPSK can also be generated with a square or rectangular patch where the feedpoints lie equidistant from the center of the patch on a line that bisects the width of the patch. The center of the patch is connected to the ground plane through a resistor-capacitor circuit (not shown) The length of the rectangular patch must be ½ wavelength but its width can be chosen based on other design considerations, known to those skilled in the art.

Figure 3:
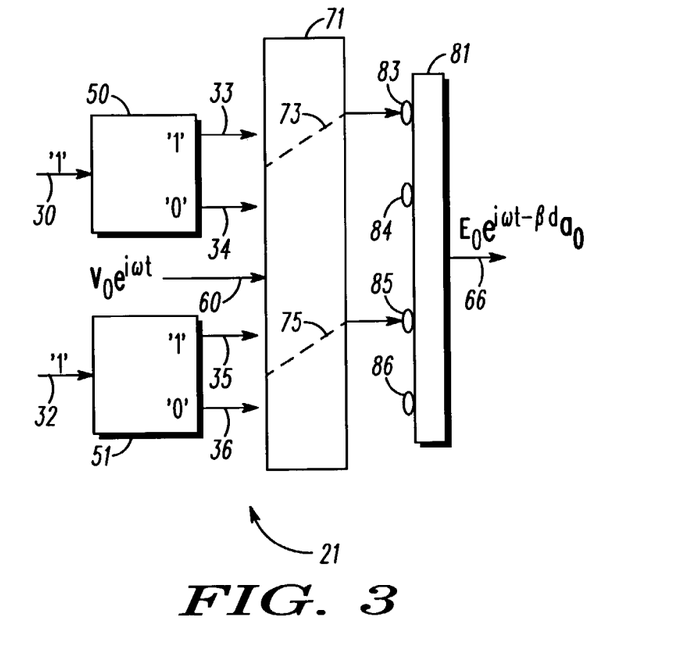
FIG. 3 illustrates a block diagram of a first embodiment of the quadrature phase antenna modulator for a first data state.

FIG. 3 illustrates a block schematic of a quadrature phase antenna modulator 21 for a first input data state. A quadrature phase antenna modulator requires two data streams, typically called the I channel and the Q channel by those skilled in the art. These two data streams can be supplied to the antenna modulator 21 from separate sources or one data stream can be split into two by, for example, placing all odd bits in one data stream and all even bits in the second data stream. The former case is illustrated here. Two separate input data streams consisting of a sequence of logic 1's and 0's, carry input data signals 30 and 32. Data signals 30 and 32 are simultaneously input into a first data modifier circuit 50 and a second data modifier circuit 51, respectively. Illustrated in FIG. 3, the input data signals 30 and 31 both have logic 1 data states. As in FIG. 1, data modifier circuit 50, outputs a first data signal 33 with a logic 1 data state and a second data signal 34, the complement of first data signal 33, with a logic 0 data state. The first data signal 33 and the second data signal 34 form the first data signal pair 33-34 with the first data state 1-0, also seen in FIG. 1. Data modifier circuit 51 acts in like manner on the input data signal 32 to form a third data signal 35 having logic 1 data state and a fourth data signal 36, the complement of the third data signal 35, having logic 0 data state. Third data signal 35 and the fourth data signal 36 form a third data signal pair 35-36 having data state 1-0. The first and third data signal pairs 33-34 and 35-36 are input into circuit 71, which has four circuit paths 73–76, illustrated in FIGS. 3, 5, 6, and 7, which feed into the antenna 81 at feedpoints 83–86, respectively. Antenna 81 is a probe fed circular patch antenna and is connected to the ground plane through a resistor-capacitor circuit (not shown) at its center point.

Figure 4:
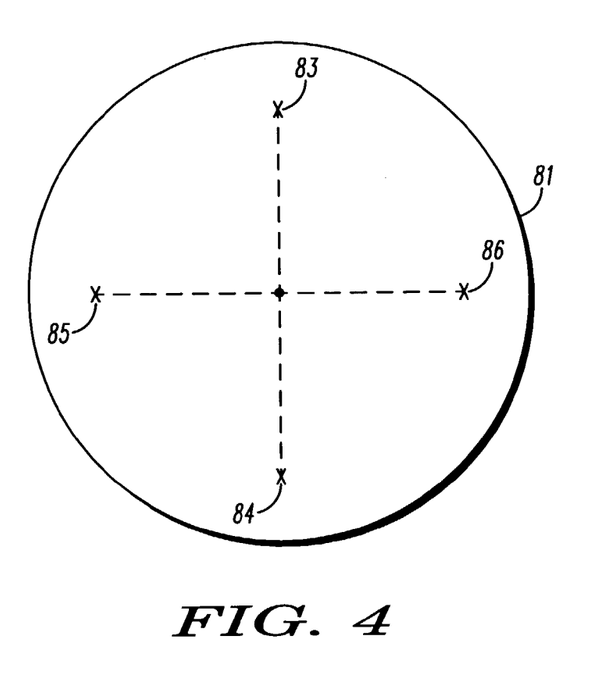
FIG. 4 illustrates, in a top view, a patch antenna for a quadrature phase antenna modulator.

FIG. 4 illustrates the relative locations of the feedpoints 83–86 on antenna 81. First and second feedpoint pairs 83, 84 and third and fourth feedpoint pairs 85, 86 are located on orthogonal diameters, shown as dashed lines, of the antenna 81 and are equidistant from the center of antenna 81. The patch antenna 81 is probe fed at two orthogonally spaced feedpoints for the quadrature phase antenna modulator 21.

In FIG. 3 the radio frequency carrier signal 60 is input into circuit 71 and in the manner described for the bi-phase antenna modulator of FIGS. 1 and 2, the first data signal pair 33-34 will adjust the circuit 71, based on the first data state of the first data signal pair 33-34, to allow the radio frequency signal 60 to travel a first circuit path 73 to feed the antenna 81 at feedpoint 83. In a similar manner, the data signal pair 35-36 adjusts the circuit 71, based on the first data state of the third data signal pair 35-36, to allow the radio frequency signal 60 to travel a third circuit path 75 to feed the antenna 81 at feedpoint 85 at the same time that antenna feedpoint 83 is being fed the radio frequency carrier signal 60. As described for FIGS. 1 and 2, the second and fourth circuit paths 74 and 76 are blocked from carrying the radio frequency carrier signal 60. When the feedpoints 83 and 85 are simultaneously fed with the radio frequency carrier signal 60, the radio frequency signal 66 emitted from the antenna 81 has a phase vector defined to be zero degrees for this description of a quadrature phase antenna modulator. The emitted radio frequency signal 66 is described as the vector $E_0 e^{i\omega t - \beta d} a_0$ where $a_0$ is a unit vector whose direction defines 0° phase.

Figure 5:
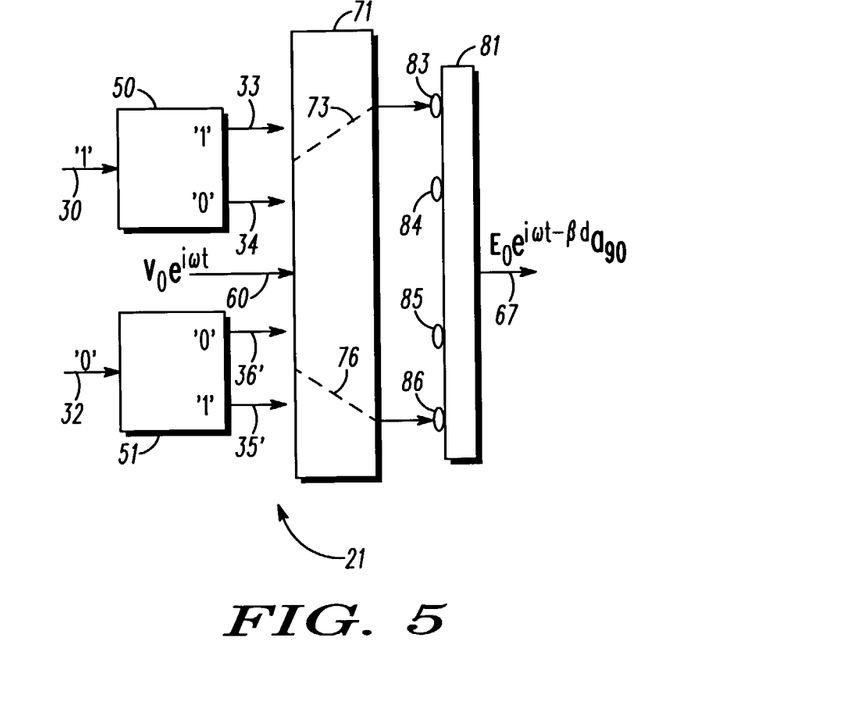
FIG. 5 illustrates a block diagram of a first embodiment of the quadrature phase antenna modulator for a second data state.

FIG. 5 illustrates a block schematic of a quadrature phase antenna modulator 21 for the second input data state. Input data signal 30 with logic 1 data state is input into data modifier circuit 50. Input data signal 32 with logic 0 data state is input into data modifier circuit 51. Again, as in FIGS. 1 and 3, the first data signal pair 33-34 is formed by data modifier circuit 50 from the input data signal 30 and the first data signal pair 33-34 adjusts circuit 71 to allow radio frequency signal 60 to travel a first circuit path 73 to feed antenna 81 at feedpoint 83. In like manner, input data signal 32 is output from data modifier circuit 51 as a fourth data signal pair 36'-35'. The fourth data signal pair 36'-35' has the second data state 0-1, which adjusts the circuit 71 to allow the radio frequency signal 60 to travel a fourth circuit path 76 to feed the antenna 81 at feedpoint 86 at the same time that antenna feedpoint 83 is being fed the radio frequency carrier signal 60. Here the second and third circuit paths 74 and 75 are blocked from carrying the radio frequency carrier signal 60. When the feedpoints 83 and 86 are simultaneously fed with the radio frequency carrier signal 60, the radio frequency signal 67 emitted from the antenna 80 has a phase vector which is shifted 90° from the phase vector of emitted radio frequency signal 66 of FIG. 3 and is described as vector $E_0 e^{i\omega t - \beta d} a_{90}$ where $a_{90}$ is a unit vector whose direction is 90° from the direction of $a_0$.

Figure 6:
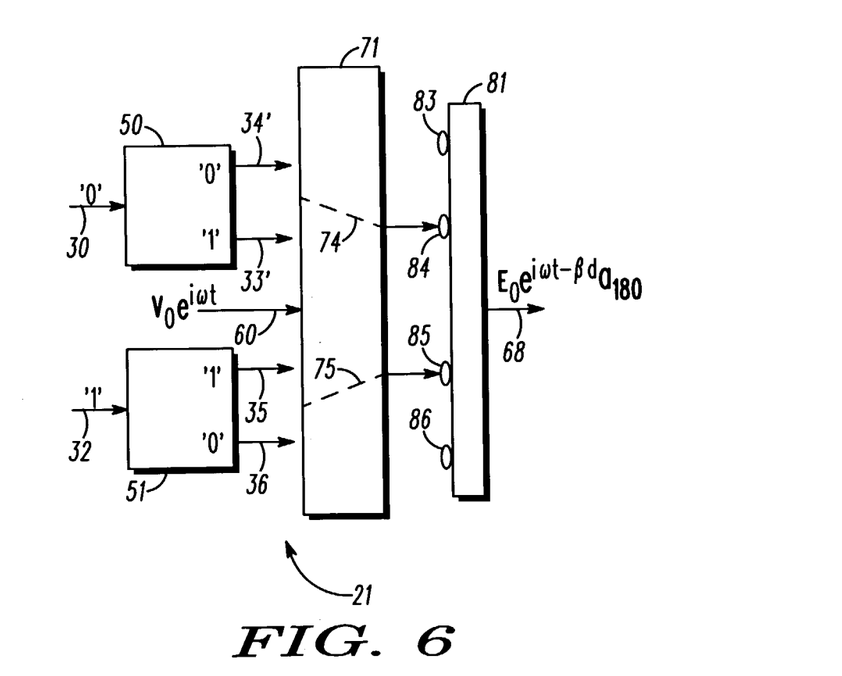
FIG. 6 illustrates a block diagram of a first embodiment of the quadrature phase antenna modulator for a third data state.
Figure 7:
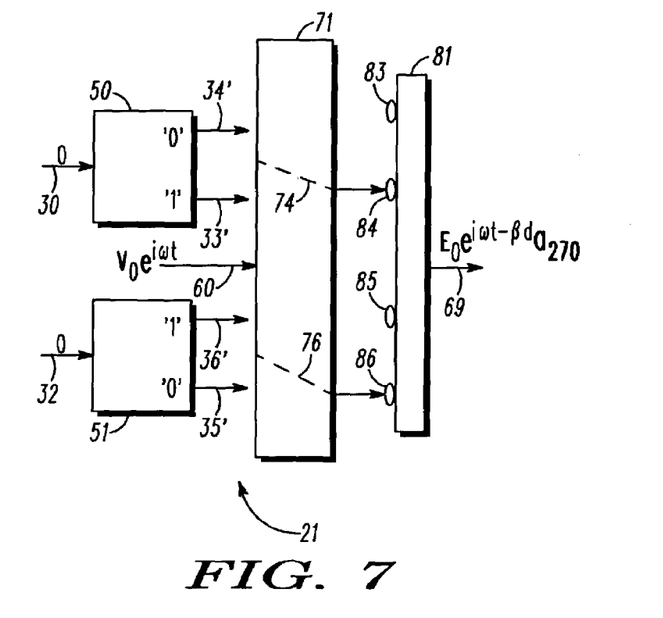
FIG. 7 illustrates a block diagram of a first embodiment of the quadrature phase antenna modulator for a fourth data state.

FIG. 6 illustrates a block schematic of a quadrature phase antenna modulator 21 for the third input data state. Input data signal 30 with logic 0 data state is input into data modifier circuit 50. Input data signal 32 with logic 1 data state is input into data modifier circuit 51. As in FIG. 2, the second data signal pair 34'-33' is formed by data modifier circuit 50 from the input data signal 31 with the second data state 0-1. The second data signal pair 34'-33' adjusts circuit 71 to allow radio frequency signal 60 to travel a second circuit path 74 to feed antenna 81 at feedpoint 84. In like manner, input data signal 32 is output from data modifier circuit 51 as the third data signal pair 35-36, as in FIG. 3. The third data signal pair 35-36 has the first data state 1-0, which adjusts the circuit 71 to allow the radio frequency signal 60 to travel a third circuit path 75 to feed the antenna 81 at feedpoint 85 at the same time that antenna feedpoint 84 is being fed the radio frequency carrier signal 60. Here, the first and fourth circuit paths 73 and 76 are blocked from carrying the radio frequency carrier signal 60. When feedpoints 84 and 85 are simultaneously fed with the radio frequency carrier signal 60, the radio frequency signal 68 emitted from the antenna 80 has a phase vector which is shifted 180° from the phase vector of emitted radio frequency signal 66 of FIG. 3 and is described as vector $E_0 e^{i\omega t - \beta d} a_{180}$ where $a_{180}$ is a unit vector whose direction is 180° from the direction of $a_0$ FIG. 7 illustrates a block schematic of a quadrature phase antenna modulator 21 for the fourth input data state. Input data signal 30 with logic 0 data state is input into data modifier circuit 50. Input data signal 32 with logic 0 data state is input into data modifier circuit 51. As in FIG. 2, the second data signal pair 34'-33' with the second data state 0-1 is formed by data modifier circuit 50 from the input data signal 30. The second data signal pair 34'-33' adjusts circuit 71 to allow radio frequency signal 60 to travel a second circuit path 74 to feed antenna 81 at feedpoint 84. In like manner input data signal 32 is output from data modifier circuit 51 as the fourth data signal pair 36'-35', as in FIG. 5. The fourth data signal pair 36'-35' has the second data state 0-1, which adjusts the circuit 71 to allow the radio frequency signal 60 to travel a fourth circuit path 76 to feed the antenna 81 at feedpoint 86 at the same time that antenna feedpoint 84 is being fed the radio frequency carrier signal 60. The first and third circuit paths 73 and 75 are blocked from carrying the radio frequency carrier signal 60. When the feedpoints 84 and 86 are simultaneously fed with the radio frequency carrier signal 60, the radio frequency signal 69 emitted from the antenna 80 has a phase vector which is shifted 270° from the phase vector of emitted radio frequency signal 66 of FIG. 3 and is described as vector $E_0 e^{i\omega t - \beta d} a_{270}$ where $a_{270}$ is a unit vector whose direction is 270° from the direction of $a_0$. This is the fourth phase of the quadrature phase modulator.

FIGS. 3, 5, 6 and 7 illustrate how the data state of the input data controls the electric field vector phase of the emitted radio frequency signal by simultaneously feeding two probe fed orthogonally spaced feedpoints.

As illustrated in FIGS. 3, 5, 6, and 7, when data stream 30 and data stream 32 are simultaneously applied to the antenna modulator 21 so that two feedpoints on orthogonal lines are simultaneously driven by the radio frequency carrier signal 60, the emitted radio frequency signal will have one of four different vector phases. Thus a quadrature phase shift keying signal is generated and radiated from this device.

At the receive end of the system, an antenna designed to receive circularly polarized signals is used. This type of receiver antenna has two orthogonal feedpoints and a 90° phase shifter in series with one of the feedpoints. The received signal from one feedpoint and the received signal from the second feedpoint after passing through the 90° phase shifter are added together to form what those skilled in the art call a QPSK signal, which is sent on to the QPSK receiver via a single coax feed line.

The quadrature phase antenna modulator can also be implemented with a square patch where the diameter of the circular patch now becomes a line bisecting the lengths of the two opposing sides. The center of the patch is connected to the ground plane through a resistor-capacitor circuit.

BPSK can be generated using the QPSK configuration by simply using the same data bit for both the I and the Q inputs. Additionally, if the radio frequency carrier signal 60 fed to the feedpoints 85 and 86 is shifted by 90 degrees with the addition of ¼ wavelength transmission lines (not shown) in the circuit paths 75 and 76 of circuit 71 shown in FIGS. 3, 5, 6, 7, the electric field vector of the radiated radio frequency signal will not only be BPSK modulated, but also it will be circularly polarized. The BPSK modulated electric field vector is linearly polarized if ¼ wavelength transmission lines are not added to circuit paths 75 and 76 to provide the 90 degree shift to the radio frequency carrier signal 60.

Figure 8:
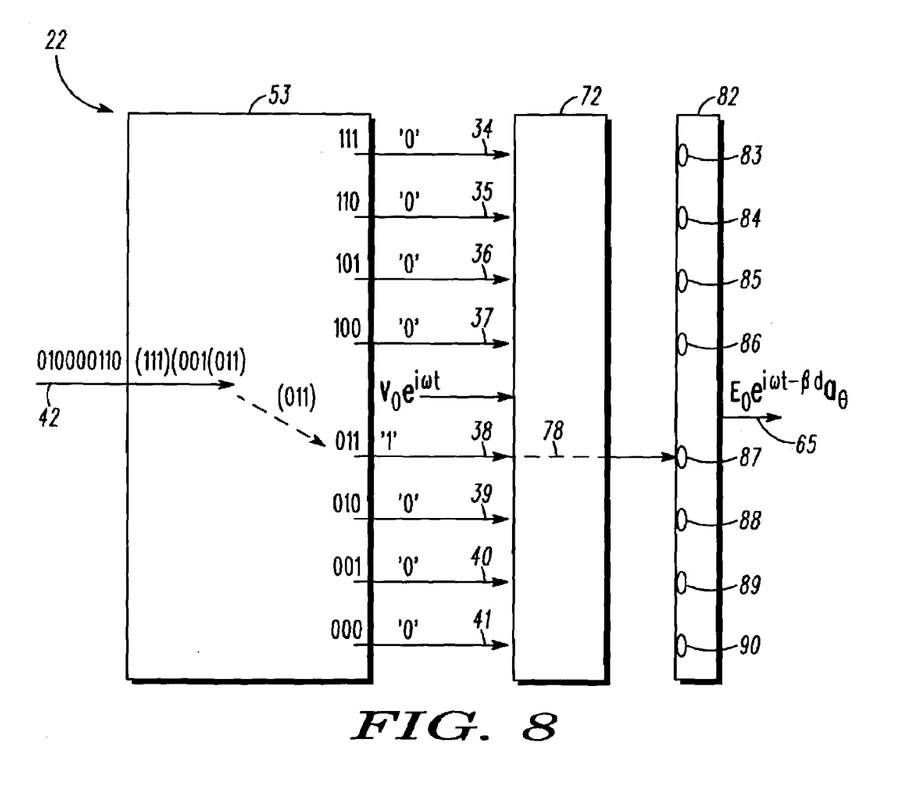
FIG. 8 illustrates a block diagram of a first embodiment of the multi-phase antenna modulator.

FIG. 8 illustrates a block schematic of a multi-phase antenna modulator 22. In this configuration a data stream 42 consisting of logic 1's and 0's is arranged by a encoder circuit 53, which groups the data based on the number of phases, M, desired in the multi-phase modulator. There are M data output ports in the encoder circuit 53, each correlated to one of the possible groupings and each contacting one of a plurality of circuit paths in circuit 72. These circuit paths (only 78 is illustrated) contact feedpoints 83–90 in antenna 82. For M desired phase shifts, there will be M feedpoints.

FIG. 8 illustrates the operation of the multi-phase modulator for M=8. When M=8, the bits in the data stream 42 will be grouped in threes, as shown in encoder circuit 53, since there are 8 ways to group 1's and 0's in groupings of three: 000, 001, 010, 011, 100, 101, 110, and 111. An exemplary data stream 42 is illustrated before and after entering encoder circuit 53, with parenthesis indicating the groupings of three that will be formed in circuit 53. The encoder circuit 53 will sequentially feed groups of data bits to circuit 72 with a logic 1 data state. Illustrated in FIG. 8, group (011) is correlated to circuit path 78 of circuit 72. It will operate to direct the radio frequency carrier signal 60, which is also input into circuit 72, to feedpoint 87 of antenna 82. All the other ports of circuit 53 connected to circuit paths in circuit 72 will have logic 0 data states and the radio frequency carrier signal 60 will be blocked from traveling all the those circuit paths (not shown) of circuit 72. When the radio frequency carrier signal 60 is fed from circuit path 78 to the feed point 87 on antenna 82 it will be emitted with a vector phase dependent upon the position of the feedpoint 87 on antenna 82.

Figure 9:
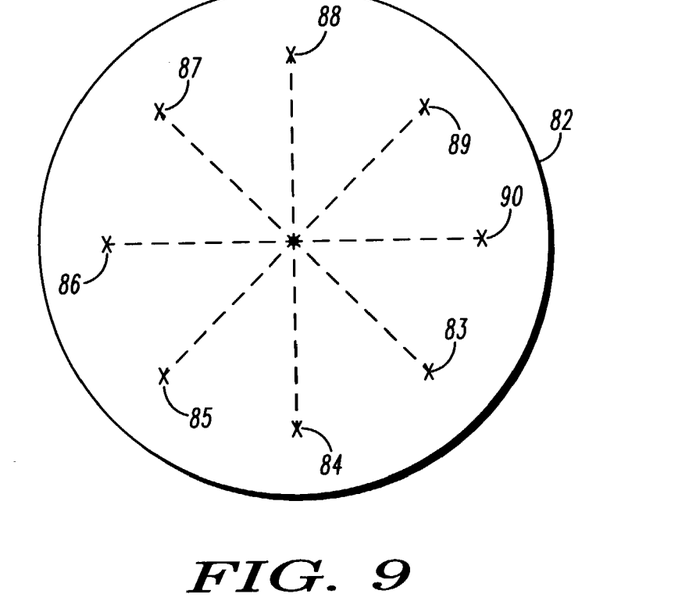
FIG. 9 illustrates, in a top view, a patch antenna for a multi-phase antenna modulator.

The relative positions of the 8 feedpoints on the probe fed patch antenna 82 are illustrated in FIG. 9. The feedpoints 83–90 lie in pairs on diameters of patch antenna 82, with the diameters having an angle of 360°/M with the two neighbor diameters. In this illustrated example, where M=8, there are 45° between adjacent diameters. All the feedpoints are equally spaced from the center of the antenna 82. The center of the antenna 82 is connected to the ground plane through a resistor-capacitor circuit (not shown For this particular geometry an emitted radio frequency signal 65, has any one of 8 possible phase vectors depending on the input data stream. The phase of the vector is shifted n times 45° (n=an integer, 0-7) from the phase vector chosen to be the 0° reference phase vector (typically n=0). Each value of n corresponds to one of the eight 3 bit data groupings. The emitted radio frequency signal is described as the vector $E_0 e^{j\omega t - \beta d} a_\theta$ where $\theta = n(360/M)$ and n is an integer ranging from 0 to M−1 which corresponds to a $\log_2 M$ group of input data bits. The vector phase depends on which of the feedpoints is utilized to feed the radio frequency carrier signal 60 to the antenna 82.

The technique used to switch the radio frequency carrier signal 60 from one feed point (83-90) to another involves the use of ¼ and ½ wavelength transmission lines, PIN diodes, and the fact that the patch antennas 80, 81 and 82 are probe fed and that the center point of a patch antenna can be connected to the ground plane through a resistor-capacitor circuit without disrupting its radiation performance. The circuits 70, 71 and 72 provide a PIN diode biasing scheme whereby the PIN diodes can be turned fully OFF as well as fully ON by a unipolar digital data signal.

Figure 10:
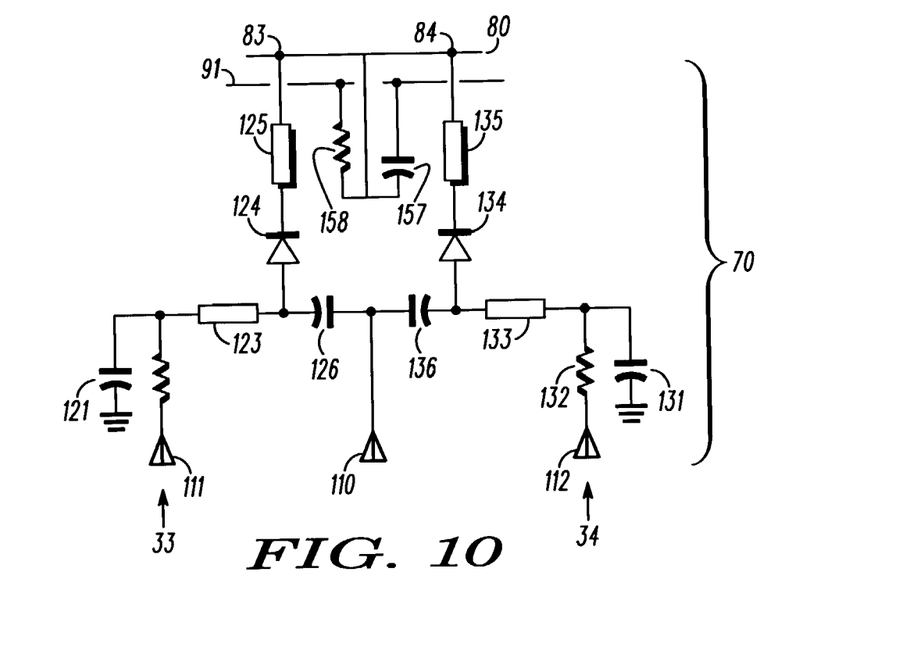
FIG. 10 illustrates a circuit schematic of a first embodiment of the bi-phase antenna modulator corresponding to FIG. 1 and FIG. 2.

FIG. 10 illustrates a circuit schematic of a first embodiment of the bi-phase antenna modulator. This circuit corresponds to circuit 70 of FIGS. 1 and 2 and antenna 80. At the exact center of patch antennas the voltage difference between the patch element and the ground plane is 0 volts. This means that the antenna 80 and the ground 91 can be connected to each other with a conductor at this point with no adverse effects. For the bi-phase antenna modulator 20 illustrated in FIGS. 1–2, the quadrature phase antenna modulator 21 illustrated in FIG. 3 and FIGS. 5–7 and the multiphase antenna modulator 22 illustrated in FIG. 8 the antenna 80 and the ground plane 91 are connected with a resistor 158 in parallel with a capacitor 157. The antenna 80 and the ground plane 91 may be integrally connected through a dielectric material, though this is not required for this invention. Resistor 158 allows a dc voltage to exist between the patch element 80 and the ground plane 91. This voltage is used to reverse bias the PIN diode 134 when it should be OFF. The resistor also provides a conduction path for the current flowing through the PIN diode 124 that is to be turned ON. The capacitor 157 keeps the voltage relatively constant during data transitions.

FIG. 10 illustrates the bi-phase antenna modulator circuit 70 and the antenna 80. The data modifier circuit 50 is not shown in this schematic as that function is known to those of ordinary skill in the art. The information bearing first data signal 33 of FIG. 1 is input at port 111. The complement of the first data signal 33, which is second data signal 34 of FIG. 1, is input at port 112. The circuit path 73 of FIG. 1 consists of components 121–126, 157, 158. The circuit path 74 of FIG. 2 consists of components 131–136, 157, 158. The radio frequency carrier signal 60 is input at 110 and is coupled to the first and second circuit paths 73 and 74 through capacitors 126 and 136, respectively. The first and second data signals 33 and 34 are applied to ¼ wavelength transmission lines 123 and 133 through resistors 122 and 132, respectively. Shunt capacitors 121 and 131 on the ¼ wavelength transmission lines 123 and 133, respectively, provide radio frequency carrier signal 60 short circuits. The opposite ends of the ¼ wavelength transmission lines 123 and 133 look like open circuits to the radio frequency carrier signal 60. The ¼ wavelength transmission lines 123 and 133 look like a conductor to the first and second data signals 33 and 34. This circuit configuration provides for coupling the data signals 33 and 34 into the remainder of the bi-phase antenna modulator circuit 100. The resistors 122 and 132 with the capacitors 121 and 131 also serve as data filters.

When the first data signal 33 is applied to input port 111 there is a positive voltage, Vd, applied to the anode of the PIN diode 124 so that PIN diode 124 is forward biased. There is a small voltage drop across the PIN diode and the resulting voltage across resistor 158, the patch data signal voltage, is slightly less than Vd. The current to turn the PIN diode 124 ON is set by Vd, resistor 122, and resistor 158. When first data signal 33, which has a positive voltage, is input at port 111, the second data signal 34 having logic 0 data state is input at port 112 so 0 volts is applied to the anode of the PIN diode 134. Because the patch data signal voltage across resistor 158 is nearly Vd (reduced by PIN diode 124 drop) PIN diode 134 is reverse biased by nearly Vd. This causes PIN diode 134 to be turned fully OFF. The opposite action occurs when the input at port 111 has a logic 0 data state and the input at port 112 has a logic 1 data state.

When the PIN diode 124 is forward biased to ON, it provides a low loss conduction path for the radio frequency carrier signal 60 which is applied to the circuit 70 through two radio frequency coupling capacitors 126 and 136. Capacitors 126 and 136 also provide for dc blocking to the radio frequency carrier signal 60 source at 110. When PIN diode 134 is reverse biased, it acts like an open circuit to the radio frequency carrier signal 60 preventing it from being coupled to the next circuit element the ½ wavelength transmission line 135. As a result the radio frequency carrier signal 60 is directed to antenna feed point 83. In this manner the radio frequency carrier signal 60 is directed through the first circuit path 73 and blocked from the second circuit path 74.

Conversely, when the input at port 111 has a logic 0 data state and the input at port 112 has a logic 1 data state, as in FIG. 2, the radio frequency carrier signal 60 is directed to antenna feed point 84, since the switching of the PIN diode pair 124-134 has caused 134 to be forward biased and PIN diode 124 to be reverse biased. This PIN diode biasing scheme provides for the maximum possible reverse bias voltage to be applied to the OFF PIN diode when only unipolar, that is 0 and Vd volts, data signals are available.

The ½ wavelength transmission lines 125 and 135 between the PIN diodes 124 and 134 and the feedpoints 83 and 84, respectively, provide an optimum electrical connection between the PIN diodes 124 and 134 and the antenna feedpoints 83 and 84, which are physically far apart compared to the physical size of the PIN diodes 125 and 135. When a ½ wavelength transmission line is loaded with any impedance, the impedance looking into the other end of the line is the same as the load impedance so there is no impedance transformation. Hence, when PIN diode 124 is biased OFF and it loads the line with a high impedance, that same high impedance appears at the other end of the line connected to the feedpoint 83 of the patch antenna 80. The length of the line can be adjusted slightly from exactly a ½ wavelength transmission to compensate for any undesired parasitic reactance at the PIN diode end of the line.

Figure 11:
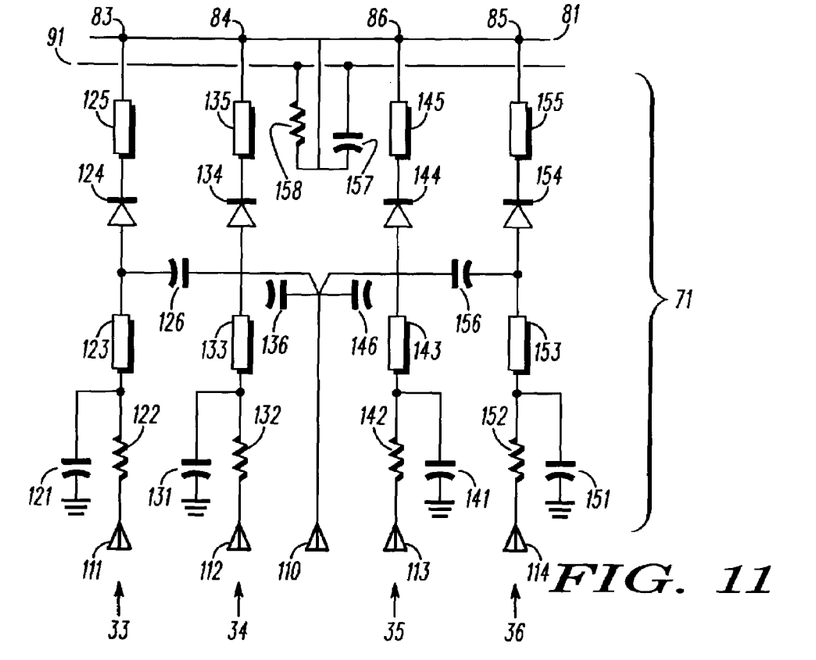
FIG. 11 illustrates a circuit schematic of a first embodiment of the quadrature phase antenna modulator corresponding to FIG. 3.

FIG. 11 illustrates the quadrature phase antenna modulator circuit 71 and the antenna 81. The data modifier circuits 50 and 51 are not shown in this schematic as that function is known to those of ordinary skill in the art. The same basic operation occurs as described for FIG. 10. In FIG. 11 there is a second set of feed points 85–86 on the antenna 81 and there are two additional circuit paths. The third circuit path 75 in FIGS. 3 and 6, consists of components 141–146, 157, 158 and the fourth circuit path 76 in FIGS. 4 and 7, consists of components 151–156, 157, 158. The third and fourth input data signals 35 and 36 of FIG. 3 are input at ports 113 and 114 respectively. The functionality of the components in the third and fourth circuit paths is identical to those of the first and second circuit paths. The first and second circuit paths 73 and 74 of FIG. 3 form a first circuit pair to receive the input data signals 33 and 34 of FIG. 3 and cause a switching of the ON/OFF state of PIN diode pairs 124 and 134 upon a change in the data state of input data signal 33, as discussed in FIG. 10, thereby directing the radio frequency carrier signal 60 to antenna feedpoint 83 or 84 based on the data state of the signal 33. Simultaneously, the third and fourth circuit paths 75 and 76 form a second circuit pair to receive the input data signals 35 and 36 which will cause a switching of the ON/OFF state of PIN diode pairs 144 and 154 upon a change in the data state of input data signal 35 thereby directing the radio frequency carrier signal 60 to one of the antenna feedpoints 85 or 86. In this manner, two feedpoints are simultaneously receiving the radio frequency carrier signal 60 to output a radio carrier signal 66, 67, 68 or 69 of FIGS. 3, 5, 6, or 7.

Figure 12:
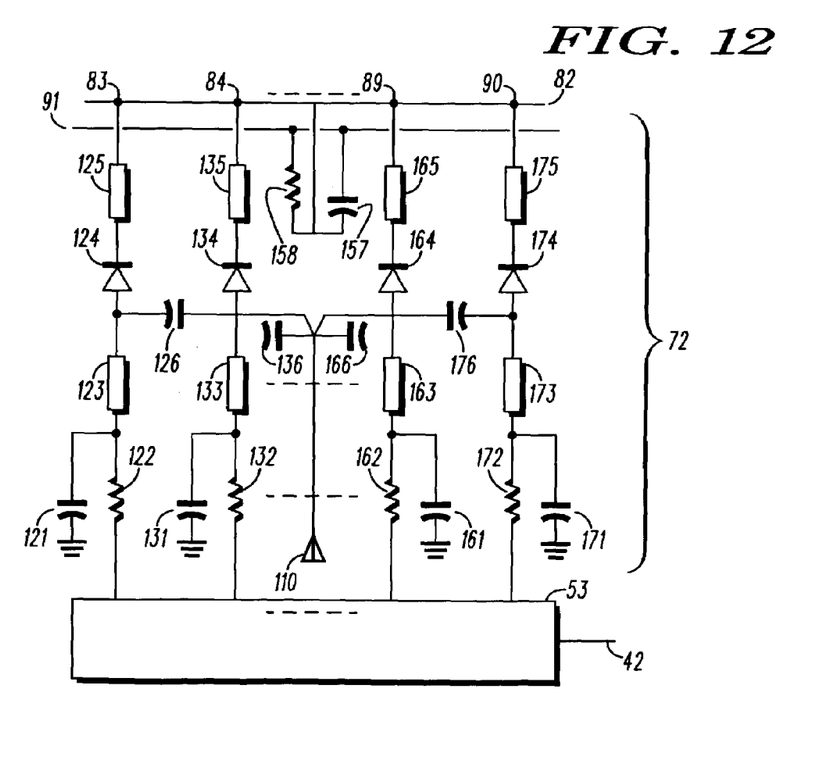
FIG. 12 illustrates a circuit schematic of an embodiment of the multi-phase antenna modulator.

FIG. 12 illustrates a schematic of the multi-phase antenna modulator circuit 72 in operation with circuit 53 and antenna 82. The horizontal dashed lines indicate a plurality of circuit paths (not shown) between circuit paths comprised of components 131–136, 157, 158 and 161-166, 157, 158. In this device, at any given time, there is only one circuit path, which allows the radio frequency carrier signal 60 to be input from port 110 to an antenna feedpoint. That circuit path will have a forward biased PIN diode 124, 134, etc. The remaining multiple circuit paths will have reversed biased PIN diodes blocking the radio frequency carrier signal 60 from feeding into the contacted antenna feed. In this manner the one feed point receiving the radio frequency carrier signal 60 will emit radiation with one of a plurality of vector phases.

Clearly, the illustrated schematics of devices 20, 21 and 22 (FIG. 1–FIG. 3 and FIG. 5–FIG. 8) are meant to illustrate a way to utilize the data state of a unipolar input signal (30, 31, 32) to modulate the phase of the radio frequency signal (60-65) emitted from a patch antenna (80-82) connected to a circuit (70-72). Bi-phase, quadrature phase and multi-phase modulation techniques were illustrated using two or more of a simple circuit path design, which blocks or allows a radio frequency carrier signal to travel the circuit path. These illustrative circuit schematics are not intended to be exhaustive of all possibilities or to limit what can be designed for the aforementioned purpose. By using what is shown and described herein, phase modulator designs are simplified and improved. The double balance mixer of typical BPSK modulators is replaced by 2 PIN diodes, microstrip lines and a simple R/C network on an existing antenna. These techniques require only one radio frequency carrier signal and use the commonly available unipolar digital data signals to provide a low loss modulator.

What is claimed is:

1. A radio frequency communication device, comprising:
an antenna including a plurality of spaced apart feedpoints; and
a circuit including a plurality of circuit paths operable to receive a data signal and a radio frequency carrier signal, each of the circuit paths operably coupled to one of the feedpoints, wherein the circuit routes the radio frequency carrier signal along the circuit paths based on a data state of the data signal, and wherein the electric field vector phase of the radio frequency signal emitted from the antenna is adjusted based on a position of the feedpoint associated with the circuit path through which the radio frequency carrier signal is routed, wherein the antenna is selected from the group consisting of a probe fed circular patch antenna having a center point on the antenna connected to the ground plane through a resistor-capacitor circuit, a probe fed square patch antenna having a center point on the antenna connected to the ground plane through a resistor-capacitor circuit and a probe fed rectangular patch antenna having a center point on the antenna connected to ground through a resistor-capacitor circuit, wherein the data signal is unipolar and comprises a first and a second data signal, the second data signal comprising the complement of the first data signal, and wherein the first data signal allows the radio frequency carrier signal to travel a first circuit path and the second data signal prevents the radio frequency carrier signal from traveling a second circuit path.

2. The radio frequency communication device of claim 1, wherein a change in the data state of the data signal switches the circuit path the radio frequency carrier signal travels, wherein, upon switching, the first data signal prevents the radio frequency carrier signal from traveling the first circuit path and the second data signal allows the radio frequency carrier signal to travel the second circuit path.

3. The radio frequency communication device of claim 2, wherein the first and second circuit paths direct the radio frequency carrier signal into an operably positioned first or second feedpoint on the antenna, wherein the first feedpoint causes the antenna to emit a radio frequency signal having a first electric field vector phase and the second feedpoint causes the antenna to emit a radio frequency signal having a second electric field vector phase, wherein the first and second electric field vector phases are 180 degrees out of phase.

4. The radio frequency communication device of claim 1, wherein the data signal is unipolar and comprises a first and second data stream, the first data stream comprising a first and a second data signal, the second data signal comprising the complement of the first data signal, and the second data stream comprising a third and fourth data signal the fourth data signal comprising the complement of the third data signal, wherein the first data signal allows the radio frequency carrier signal to travel a first circuit path and the second data signal prevents the radio frequency carrier signal from traveling a second circuit path, and wherein the third data signal allows the radio frequency carrier signal to travel a third circuit path and the fourth data signal prevents the radio frequency carrier signal from traveling a fourth circuit path.

5. The radio frequency communication device of claim 4, wherein a change in the data state of the first data signal prevents the radio frequency carrier signal from traveling the first circuit path, wherein the second data signal allows the radio frequency carrier signal to travel the second circuit path, and wherein a change in the data state of the third data signal prevents the radio frequency carrier signal from traveling the third circuit path, wherein the fourth data signal allows the radio frequency carrier signal to travel the fourth circuit path.

6. The radio frequency communication device of claim 5, wherein the first or second circuit path and the third or fourth circuit path simultaneously direct the radio frequency carrier signal into operably positioned first and second feedpoints to emit from the antenna a radio frequency signal having one of four electric field vector phases based on the data state of the first and third data signals and wherein the four electric field vector phases are 90° out of phase with each other.

7. The radio frequency communication device of claim 5, wherein the first data stream is identical to the second data stream, wherein the first and second circuit paths contain quarter wave transmission lines, and wherein the first or second circuit path and the third or fourth circuit path simultaneously direct the radio frequency carrier signal into operably positioned first and second feedpoints to emit from the antenna a radio frequency signal having a first circularly polarized electric field vector or a second circularly polarized electric field vector, wherein the first circularly polarized electric field vector and the second circularly polarized electric field vector are 180° out of phase with each other.

8. The radio frequency communication device of claim 1, wherein the data signal comprises a data stream of logic 1 and logic 0 bits.

9. The radio frequency communication device of claim 8, wherein the circuit further comprises an encoder circuit operable to organize a portion of the data signal into one of a plurality of groupings of multiple logic bits, wherein each grouping of multiple logic bits is operable to allow the radio frequency carrier signal to travel a circuit path, wherein the circuit path directs the radio frequency carrier signal to an operably positioned feedpoint on the antenna, wherein application of the radio frequency carrier signal to the feedpoint causes the antenna to emit a radio frequency signal having one of a plurality of electric field vector phases based on the input data signal.

10. The radio frequency communication device of claim 1, further comprising:
a quarter wave transmission line and a shunt capacitor on each of the plurality of circuit paths, operably configured to provide coupling of the data signal to the plurality of circuit paths, radio frequency carrier signal isolation, and capacitance tuning.

11. The radio frequency communication device of claim 1, further comprising:
a PIN diode on each of the plurality of circuit paths, operably configured to switch the radio frequency carrier signal from a first circuit path to a second circuit path.

12. The radio frequency communication device of claim 1, further comprising:
at least two radio frequency coupling capacitors, operably configured to block direct current from the radio frequency carrier signal source and to couple the radio frequency carrier signal to the plurality of circuit paths.

13. The radio frequency communication device of claim 1, further comprising:
half wavelength transmission lines on each of the plurality of circuit paths, operably configured to provide isolation between the feedpoints on the antenna.

14. The radio frequency communication device of claim 1, further comprising:
connecting the center point of the probe fed patch antenna to the ground plane through a resistor-capacitor circuit, wherein the resistor-capacitor circuit is part of a first and a second circuit path, wherein the current flows through a first PIN diode in at least a first circuit path to turn ON the first PIN diode, and wherein the patch data signal voltage between the antenna and ground plane reverse biases a second PIN diode in at least a second circuit path to turn OFF the second PIN diode.

15. A method for operating a radio frequency communication device, the method comprising:
receiving a radio frequency carrier signal;
receiving a data signal;
determining at least one circuit path associated with a position along an antenna based on a data state of the data signal;
emitting a radio frequency signal; and
adjusting the electric field vector phase of the emitted radio frequency signal based on the determined circuit path, wherein the data signal comprises a first and second data signal, the second data signal comprising the complement of the first data signal.

16. The method of claim 15, wherein the radio frequency carrier signal is a continuous wave signal at a predetermined frequency.

17. The method of claim 15, wherein the data signal is unipolar.

18. The method of claim 15, further comprising:
operably positioning half wavelength transmission lines to prevent impedance transformation, upon switching between a first circuit path and a second circuit path.

19. The method of claim 15, wherein determining at least one circuit path associated with a position along an antenna based on a data state of the data signal comprises:
switching diodes of a diode pair between an ON or OFF state, wherein one of the diode pair is OFF and the other of the diode pair is ON;
isolating the data signal source from the radio frequency carrier signal with quarter wave transmission lines; and
directing the radio frequency carrier signal along at least one circuit path with the diode pair and a pair of capacitors.

20. The method of claim 15, wherein determining at least one circuit path associated with a position along an antenna based on a data state of the data signal comprises:
switching diodes of a diode plurality between an ON or OFF state, wherein one of the diode plurality is ON and the remainder of the diode plurality are OFF;
isolating the data signal source from the radio frequency carrier signal with quarter wave transmission lines; and directing the radio frequency carrier signal along one circuit path with the plurality of diodes.

21. The method of claim 15, wherein adjusting the electric field vector phase of the emitted radio frequency signal based on the determined circuit path, comprises:
feeding the radio frequency carrier signal to an antenna feedpoint set by the determined circuit path.

22. A method for operating a radio frequency communication device, the method comprising:
receiving a radio frequency carrier signal;
receiving a data signal;
determining at least one circuit path associated with a position along an antenna based on a data state of the data signal;
emitting a radio frequency signal; and
adjusting the electric field vector phase of the emitted radio frequency signal based on the determined circuit path, wherein the data signal, comprises a first and second data stream, wherein the first data stream comprises a first and a second data signal, the second data signal comprising the complement of the first data signal, wherein the second data stream comprises at least a third and a fourth data signal, the fourth data signal comprising the complement of the third data signal.

23. The method of claim 22, wherein determining at least one circuit path associated with a position along an antenna based on a data state of the data signal comprises:
switching diodes of two diode pairs between an ON or OFF state, wherein a first of each diode pair is OFF and a second of each diode pair is ON;
isolating the data signal source from the radio frequency carrier signal with quarter wave transmission lines; and
directing the radio frequency carrier signal along two circuit paths simultaneously with the two diode pairs and capacitors.

24. A method for operating a radio frequency communication device the method comprising:
receiving a radio frequency carrier signal;
receiving a data signal;
determining at least one circuit path associated with a position along an antenna based on a data state of the data signal;
emitting a radio frequency signal; and
adjusting the electric field vector phase of the emitted radio frequency signal based on the determined circuit path, wherein adjusting the electric field vector phase of the emitted radio frequency signal based on the determined circuit path, comprises:
feeding a radio frequency carrier signal traveling simultaneously along two circuit paths to an antenna at two orthogonally spaced feedpoints set by the two circuit paths.

25. A radio frequency communication device comprising:
means for receiving an radio frequency carrier signal;
means for receiving at least a first data signal;
means for determining a circuit path based on a data state of the first data signal; and
means for adjusting the electric field vector phase of an emitted radio frequency signal based on the determined circuit path, further comprising:
means for orthogonally spacing the feedpoints of a probe fed patch antenna to implement quadrature phase modulation.

26. The means of claim 25, further comprising:
means for positioning half wavelength transmission lines to prevent impedance transformation, upon switching between a first circuit path and a second circuit path.

27. A data transmission device comprising:
a circuit including a plurality of circuit paths, each circuit path including a quarter wave transmission line and shunt capacitor, operable to receive a unipolar data signal and a radio frequency carrier signal, wherein the circuit mutes the radio frequency carrier signal along a circuit path based on a data state of the data signal and the circuit prevents routing the radio frequency carrier signal along other circuit paths based on the data state of a complement of the data signal; and
a probe fed antenna including a center point connected to the ground plane through a resistor-capacitor circuit, the antenna having a plurality of spaced apart feedpoints on opposing sides of the center point, each feedpoint operably connected to a circuit path, wherein the radiated radio frequency signal is phase modulated based on the feedpoint connected to the circuit path by the data signal.

28. The device of claim 27 wherein each circuit path includes a data signal source connected to the feedpoint through a resistor in sequence with a quarter wavelength transmission line in sequence with a diode in sequence with a half wavelength transmission line.

29. The device of claim 28 wherein the diode is a PIN diode.

30. The device of claim 27 wherein the antenna is selected from the group consisting of a square patch antenna, a circular patch antenna, and a rectangular patch antenna.

* * * * *